United States Patent
Kimura

(10) Patent No.: US 12,158,702 B2
(45) Date of Patent: Dec. 3, 2024

(54) EXPOSURE DEVICE

(71) Applicant: NanoSystem Solutions, Inc., Okinawa (JP)

(72) Inventor: Kazuhiko Kimura, Okinawa (JP)

(73) Assignee: NANOSYSTEM SOLUTIONS, INC., Okinawa (JP)

( * ) Notice: Subject to any disclaimer, the term of this patent is extended or adjusted under 35 U.S.C. 154(b) by 0 days.

(21) Appl. No.: 17/910,632

(22) PCT Filed: Mar. 11, 2021

(86) PCT No.: PCT/JP2021/009927
§ 371 (c)(1),
(2) Date: Sep. 9, 2022

(87) PCT Pub. No.: WO2021/182588
PCT Pub. Date: Sep. 16, 2021

(65) Prior Publication Data
US 2023/0136440 A1 May 4, 2023

(30) Foreign Application Priority Data
Mar. 11, 2020 (JP) .................. 2020-041771

(51) Int. Cl.
*G03F 7/00* (2006.01)
*G02B 27/28* (2006.01)

(52) U.S. Cl.
CPC ........ *G03F 7/70191* (2013.01); *G02B 27/283* (2013.01)

(58) Field of Classification Search
CPC ............. G03F 7/70191; G03F 7/70291; G03F 7/70358; G03F 7/70025; G03F 7/7055; G02B 27/283; G02B 27/48
See application file for complete search history.

(56) References Cited

U.S. PATENT DOCUMENTS 9,223,122 B2 * 12/2015 Inoko .................. G03B 21/208
9,239,525 B2 * 1/2016 Owa ................... G03F 7/70291
(Continued)

FOREIGN PATENT DOCUMENTS

| EP | 1280007 A2 | 1/2003 |
| JP | 2001-135562 | 5/2001 |

(Continued)

OTHER PUBLICATIONS

International Search Report issued in corresponding PCT Application No. PCT/JP2021/009927 filed Mar. 11, 2021.
(Continued)

*Primary Examiner* — Hung V Nguyen
(74) *Attorney, Agent, or Firm* — Cozen O'Connor

(57) ABSTRACT

Provided is an exposure device capable of improving exposure accuracy while ensuring throughput. The exposure device 100 includes: a reflective liquid-crystal modulating device 21, 22; a light source device 10 uniformly illuminating the reflective liquid-crystal modulating device 21, 22 with power-stabilized pulsed laser light in a ultraviolet wavelength band; a projection optical system 30 forming an image of reflected light modulated by the reflective liquid-crystal modulating device 21, 22; and a stage 40 supporting a target on which exposure is performed by a pattern imaged by the projection optical system 30.

12 Claims, 8 Drawing Sheets

(56) References Cited

U.S. PATENT DOCUMENTS

| | | | |
|---|---|---|---|
| 9,599,906 B2* | 3/2017 | Watanabe | G03F 7/70291 |
| 10,734,789 B2* | 8/2020 | Nishioka | H01S 5/34346 |
| 2006/0115752 A1 | 6/2006 | Latypov et al. | |
| 2007/0222961 A1 | 9/2007 | Schmidt | |
| 2008/0304030 A1 | 12/2008 | Lous | |
| 2015/0219980 A1 | 8/2015 | Saito et al. | |

FOREIGN PATENT DOCUMENTS

| | | |
|---|---|---|
| JP | 2006-319140 | 11/2006 |
| JP | 2008-210814 | 9/2008 |
| JP | 2009-071116 | 4/2009 |
| JP | 2012.114358 | 6/2012 |
| JP | 2017-022168 | 1/2017 |
| JP | 2017-161603 | 9/2017 |

OTHER PUBLICATIONS

Written Opinion issued in corresponding PCT Application No. PCT/JP2021/009927 filed Mar. 11, 2021.

Search Report dated Mar. 25, 2024, issued in European Patent Application No. 21768940.5.

Notice of Reasons for Refusal (with partial translation) dated Aug. 9, 2024, issued in Taiwanese Patent Application No. 110108255, 7 pages.

Notice of Reasons For Refusal (with English translation) dated Oct. 3, 2024, issued in Japanese Patent Application No. 2022-507286, 10 pages.

* cited by examiner

EXPOSURE DEVICE

RELATED APPLICATIONS

This is a U.S. National Phase Application under 35 USC 371 of International Application PCT/JP2021/009927 filed on Mar. 11, 2021.

This application claims the priority of Japanese application no. 2020-041771 filed Mar. 11, 2021, the entire content of which is hereby incorporated by reference.

FIELD OF THE INVENTION

The present invention relates to an exposure device using a laser as a light source, and particularly to an exposure device using a reflective liquid-crystal modulating device.

BACKGROUND OF THE INVENTION

There is known an exposure device including an illumination device including a scanning device with scanning illumination light, an optical element that is a hologram recording medium on which scanning light impinges, a spatial light modulator illuminated by light from the optical element, and an imaging optical system forming an image of light modulated by the spatial light modulator on a target (JP 2012-114358 A). In the device of JP 2012-114358 A, the use of, for example, LCOS as the spatial light modulator is proposed.

However, the exposure performed using the scanning device requires time required for scanning, and unless the scanning is dense, uniformity of illumination cannot be improved, and there is a limit to improvement of the throughput while ensuring exposure accuracy.

As another exposure device, there is known a device including an illumination light source, an intensity-uniformized optical system, a digital micromirror device that forms a pattern, and a projection lens that projects the pattern formed by the digital micromirror device (JP 2001-135562 A).

However, in the digital micromirror device, a tilt angle of a micromirror is large in-plane variation, and an individual difference between the devices is large, so that it is not easy to ensure the uniformity of in-plane illuminance. Further, in the digital micromirror device, it is not easy to finely control gradation, and when the gradation is finely controlled, display time tends to be long because the gradation is controlled by time division, so that there is a limit to improvement of throughput of exposure. The digital micromirror device requires inclined incident illumination, and the optical system is not easy to assemble.

SUMMARY OF THE INVENTION

The present invention has been made in view of the above-described background art, and an object of the invention is to provide an exposure device capable of improving the exposure accuracy while ensuring throughput.

In order to achieve the above-mentioned object, an exposure device according to the present invention includes: a reflective liquid-crystal modulating device: a light source device uniformly illuminating the reflective liquid-crystal modulating device with power-stabilized and pulsed laser light in an ultraviolet wavelength band: a projection optical system forming an image of reflected light modulated by the reflective liquid-crystal modulating device; and a stage supporting a target on which exposure is performed by a pattern imaged by the projection optical system.

In the exposure device described above, the reflective liquid-crystal modulating device is uniformly illuminated with the pulsed laser light, and the exposure is performed on the target on the stage by the pattern imaged by the projection optical system from the reflected light modulated by the reflective liquid-crystal modulating device, so that the exposure throughput can be maintained while the illuminance adjustment by the reflective liquid-crystal modulating device is performed with high accuracy. It is noted that, when the exposure is performed by changing the region while moving the stage, there is a certain limit to a moving speed from the viewpoint of ensuring highly accurate stage movement, and it is easy to perform rewriting the pattern of the reflective liquid-crystal modulating device for each picture or screen at a speed corresponding to the speed limit.

According to the specific aspect of the present invention, in the exposure device, while moving the target by the stage, exposures are performed at predetermined periodic timing, and the pattern in the reflective liquid-crystal modulating device is rewritten between the exposures. In this case, the exposure can be performed while continuously moving the stage, and the exposure with high accuracy can be performed quickly.

According to another aspect of the present invention, while moving the stage, exposures are sequentially performed on different partial regions of the target to expose the entire target. In this case, an exposure pattern can be transferred with spatial resolution higher than a pixel density of the reflective liquid-crystal modulating device.

According to yet another aspect of the present invention, the light source device includes a pulse laser and generates exposure light with a pulse width that can be considered that the stage is substantially stopped. In this case, the exposure with a short pulse can be performed by the pulse laser while stabilizing the movement of the stage, and the accuracy of the exposure pattern can be improved.

According to yet another aspect of the present invention, superposed exposure is performed with a predetermined shift amount of the pixel pitch or less. In this case, the resolution can be improved by setting a predetermined shift amount and combining a superposed pattern.

According to yet another aspect of the present invention, the exposure device further includes: two reflective liquid-crystal modulators; and a beam splitter splitting and distributing the laser light from the light source device into the two reflective liquid-crystal modulating devices according to a polarized state, wherein the beam splitter synthesizes the reflected light modulated by the two reflective liquid-crystal modulating devices. In this case, multiple exposures can be performed, and a processing speed of the exposure can be increased.

According to yet another aspect of the present invention, the beam splitter is a polarizing beam splitter, light having different polarized states is incident on the two reflective liquid-crystal modulating devices, and the reflected light having different polarized states modulated by the two reflective liquid-crystal modulating devices is synthesized. In this case, the laser light from the light source device can be efficiently used.

According to yet another aspect of the present invention, the two reflective liquid-crystal modulating devices have substantially the same pixel array pattern and are arranged so as to cause the predetermined shift in the image synthesized by the polarizing beam splitter. In this case, the resolution can be improved by setting the predetermined shift amount and combining the pattern formed on the two reflective liquid-crystal modulating devices.

According to yet another aspect of the present invention, the predetermined shift is the pixel pitch or less. In this case, the resolution can be improved by setting the predetermined shift amount and combining the pattern formed on the two reflective liquid-crystal modulating devices.

According to yet another aspect of the present invention, the light source device monitors the pulsed laser light source and energy of the laser light from the pulsed laser light source and blocks an output of the laser light when the energy reaches to a predetermined threshold value. When the exposure is repeated while moving the stage, the energy level can be prevented from fluctuating with each exposure, and the exposure accuracy of the repeated exposure pattern can be improved as a whole.

According to yet another aspect of the present invention, the reflective liquid-crystal modulating device adjusts a line width of the pattern to be exposed to the target by controlling gradation of the reflected light. Compared with a digital mirror device, the reflective liquid-crystal modulating device can easily allow the gradation to be finer, can widen the adjustment range of the line width of the pattern, and can perform the exposure with high accuracy.

According to yet another aspect of the present invention, the exposure device further includes a surface observation system monitoring an alignment state of the pattern with respect to the target on the stage, wherein the surface observation system superposes and enables to observe the pattern on the reflective liquid-crystal modulating device and the pattern provided on the target on the stage.

According to yet another aspect of the present invention, the exposure device includes an autofocus system monitoring an image-formed state of a target on the stage.

DETAILED DESCRIPTION OF THE DRAWINGS

Hereinafter, an exposure device according to an embodiment of the present invention and operations thereof will be described with reference to the drawings.

Figure 1:
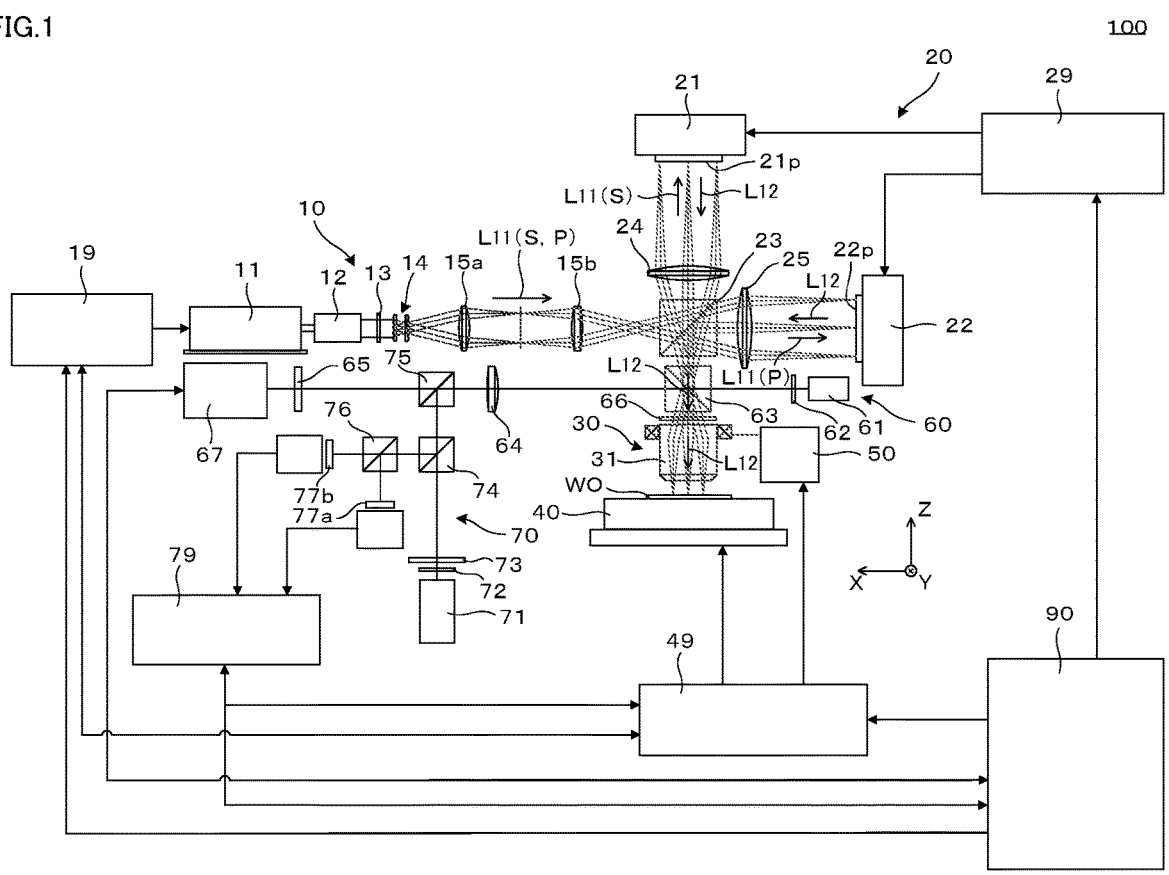
FIG. 1 is a block diagram describing an overall configuration of an exposure device according to an embodiment.

With reference to FIG. 1, an exposure device 100 according to the embodiment includes a light source device 10, an optical modulation unit 20, a projection optical system 30, a target stage 40, a lens stage 50, and a control device 90. The exposure device 100 includes a surface observation system 60 and an autofocus system 70 as portions associated with an exposure operation.

The light source device 10 is an illumination light source for ultraviolet rays, which denotes a wavelength of 10 to 400 nm, but practically, a wavelength of 300 to 400 nm is targeted. The light source device 10 includes a pulse laser 11, a laser output stabilizing device 12, a λ/2 wave plate 13, a homogenizer 14, relay lenses 15a and 15b, and a laser controller 19. The pulse laser 11 is a Q-switched pulse YAG laser and outputs, for example, an ultraviolet laser pulse having a wavelength of 355 nm in response to a trigger signal from an outside. The laser output stabilizing device 12 described in detail later is a portion for controlling an energy value of a laser pulse output from the light source device 10. The λ/2 wave plate 13 is arranged to adjust a polarization direction of the laser beam output from the pulse laser 11 via the laser output stabilizing device 12. The homogenizer 14 two-dimensionally homogenizes the laser beam, and the relay lenses 15a and 15b are portions for guiding a homogenized laser light bundle L11 to the optical modulation unit 20 with an appropriate size. The homogenizer 14 can have a configuration in which fly-eye lenses are used in two stages, but a light tunnel or other members can be used. The laser controller 19 operates under the control of the control device 90 and a stage controller 49, outputs the trigger signal to the pulse laser 11, and controls output timing of the ultraviolet laser pulse.

The optical modulation unit 20 includes two reflective liquid-crystal modulating devices 21 and 22, a polarizing beam splitter 23, lenses 24 and 25, and a modulation control device 29. The two reflective liquid-crystal modulating devices 21 and 22 have the same structure. The first reflective liquid-crystal modulating device 21, also called LCOS (Liquid Crystal On Silicon), includes pixels in a matrix array that changes a polarized state. The first reflective liquid-crystal modulating device 21 spatially modulates the polarized state of the laser light bundle of an S-polarized component reflected by the polarizing beam splitter 23. The second reflective liquid-crystal modulating device 22, also called LCOS, includes pixels in a matrix array that changes the polarized state. The second reflective liquid-crystal modulating device 22 spatially modulates the polarized state of the laser light bundle of a P-polarized component transmitted through the polarizing beam splitter 23. Herein, the first reflective liquid-crystal modulating device 21 and the second reflective liquid-crystal modulating device 22 have substantially the same pixel array or arrangement pattern. Laser light bundles having different polarized states are incident on the first reflective liquid-crystal modulating device 21 and the second reflective liquid-crystal modulating device 22 due to optical branching by the polarizing beam splitter 23. The lenses 24 and 25 have a role of converting a main light beam of the laser light bundle with which the reflective liquid-crystal modulating devices 21 and 22 are illuminated into a parallel light bundle. The lenses 24 and 25 function as a portion of the projection optical system 30 in the sense that pattern surfaces 21p and 22p of the reflective liquid-crystal modulating devices 21 and 22 are projected onto a surface of a target work WO. Pattern light L12, which is the P-polarized component modulated by the first reflective liquid-crystal modulating device 21, is converted into information reflecting a luminance pattern by passing through the polarizing beam splitter 23 and is incident on an objective lens 31. The pattern light L12, which is the S-polarized component modulated by the second reflective liquid-crystal modulating device 22, is converted into information reflecting the luminance pattern by being reflected by the polarizing beam splitter 23 and incident on the objective lens 31. The modulation control device 29 operates under the control of the control device 90 and controls a pattern or an amount of rotation of the polarization angle to be formed by the reflective liquid-crystal modulating devices 21 and 22 in units of a pixel.

Figure 2:
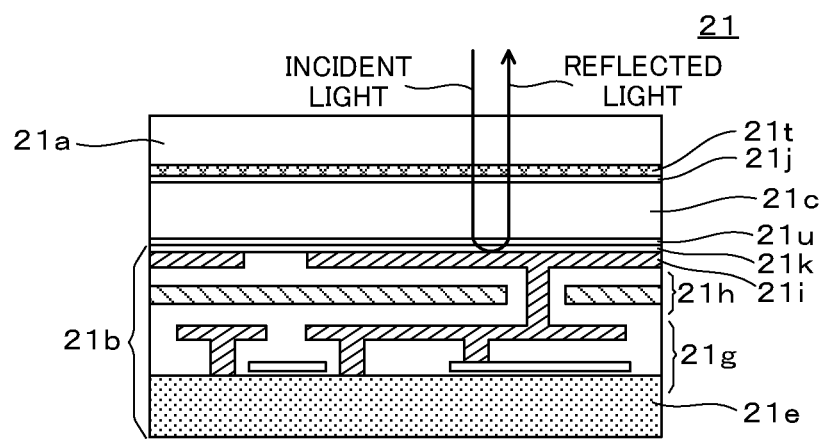
FIG. 2 is a conceptual cross-sectional view describing a structure of a reflective liquid-crystal modulating device.

FIG. 2 is a cross-sectional view illustrating an example of a structure of the first reflective liquid-crystal modulating device 21. The first reflective liquid-crystal modulating device 21 has the structure in which a liquid crystal layer 21c is interposed between a light transmitting substrate 21a and a circuit functional layer 21b. A transparent electrode 21t is formed on a surface of the light transmitting substrate 21a. The circuit functional layer 21b includes a circuit layer 21g, a light-shielding layer 21h, and a reflective pixel electrode layer 21i on an Si substrate 21e. An alignment film or layer 21j is formed on the surface of the transparent electrode 21t covering the light transmitting substrate 21a, and an alignment film 21k and a dielectric multilayer film 21u are formed on the surface of the reflective pixel electrode layer 21i on the liquid crystal layer 21c side. The first reflective liquid-crystal modulating device 21 is assumed to be used in the ultraviolet wavelength band, the light transmitting substrate 21a is made of synthetic quartz, the liquid crystal layer 21c has less absorption in an ultraviolet band (particularly in the wavelength band longer than 300 nm), the alignment films 21j and 21k are made of $SiO_2$, and the reflective pixel electrode layer 21i is formed of the dielectric multilayer film. The first reflective liquid-crystal modulating device 21 has a structure that can withstand long-term use in the ultraviolet band. Although not illustrated, the second reflective liquid-crystal modulating device 22 also has the same structure as the first reflective liquid-crystal modulating device 21 and can withstand long-term use in the ultraviolet band. The first reflective liquid-crystal modulating device 21 and the second reflective liquid-crystal modulating device 22 have the feature where a display time hardly changes even if gradation is increased as compared with a digital micromirror device. Specifically, about 1000 shades or gradations can be achieved with 10-bit information, and desired light intensity can be achieved simply by performing irradiation with the laser light bundle L11 having desired energy in a pulse shape. It is noted that, in the case of the digital micromirror device, it is necessary to express gradation by time modulation, and there is a problem that the time required for exposure is increased as the gradation is increased.

Returning to FIG. 1, in the projection optical system 30, the objective lens 31 cooperates with the lenses 24 and 25 of the optical modulation unit 20 to project the pattern light modulated by the optical modulation unit 20 onto the surface of the work WO supported on the target stage 40, specifically, on a resist film. The objective lens 31 can achieve high resolution in response to ultraviolet rays. With respect to the resist film, when a required energy amount of light is applied, a chemical reaction does not occur instantly, but photosensing gradually progresses. Projection magnification by the projection optical system 30 is not particularly limited, and for example, 1 times magnification projection is possible, and 1/16 times projection is also possible. The specific objective lens 31 is of a 1/16 times reduced projection type, and has NA of, for example, about 0.75. When 1/16 times projection is performed, the pixel size of the reflective liquid-crystal modulating devices 21 and 22 is 8 μm, and the pixel size on the surface of the work WO is 0.5 μm.

The target stage 40 can support the work WO and move in an XY direction and can be rotated around an X axis, a Y axis, and a Z axis. The operation of the target stage 40 is controlled by the stage controller 49, and under the control of the control device 90, the work WO can be accurately moved to a predetermined position, and the work WO can be moved along a predetermined path at a desired speed. The work WO is, for example, the mask for exposure, but may be the semiconductor wafer or the like.

The lens stage 50 can move the objective lens 31 up and down in the Z direction. The operation of the lens stage 50 is controlled by the stage controller 49, and under the control of the control device 90, the objective lens 31 can be moved in the Z direction to finely adjust the focus state of the pattern projected onto the work WO.

The surface observation system 60 includes a surface observation light source 61, a polarizing plate 62, a dichroic half mirror prism 63, a lens 64, a polarizing plate 65, a λ/4 plate 66, and a CCD camera 67. The surface observation system 60 is fixed relative to the optical modulation unit 20.

Figure 3:
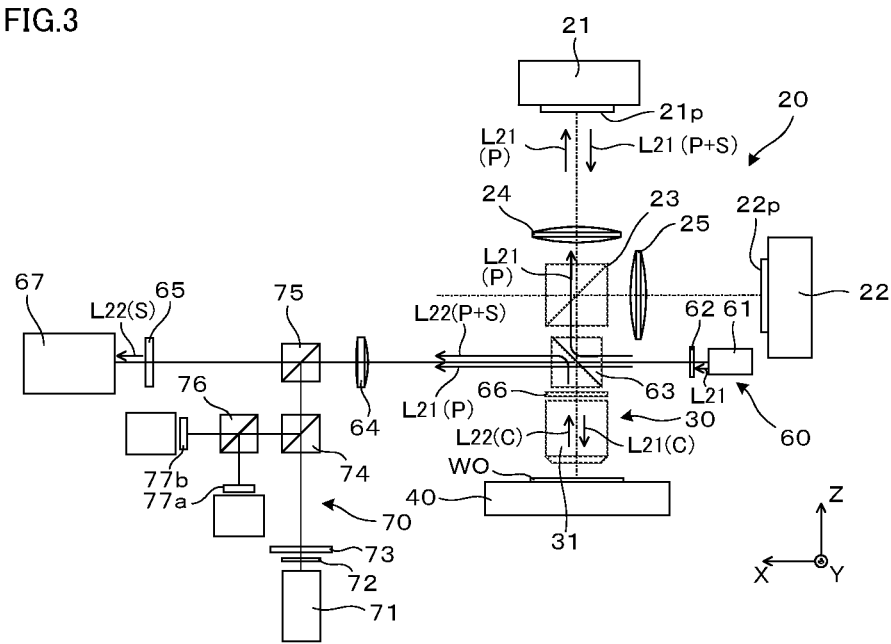
FIG. 3 is an explanatory diagram of an optical path from which a surface observation system is extracted.

FIG. 3 illustrates the surface observation system 60 extracted. The surface observation light source 61 is configured with, for example, an LED or the like and emits illumination light L21 (for example, yellow light having a wavelength of 567 nm or other visible light) having a long wavelength and causing substantially no photosensitivity to a resist formed on the surface of the work WO on the target stage 40. The polarizing plate 62 cuts the S polarization and made P polarization to be selectively incident into the dichroic half mirror prism 63. The dichroic half mirror prism 63 selectively reflects the illumination light L21 and allows the illumination light L21 in the P-polarized state to be incident on the first reflective liquid-crystal modulating device 21 via the polarizing beam splitter 23 and the lens 24. The reflected light from the first reflective liquid-crystal modulating device 21 includes a P component and an S component. The polarizing beam splitter 23 branches the polarized light with respect to the laser light bundle L11 in the ultraviolet band and does not branch the polarized light with respect to the long-wavelength illumination light L21, and the reflected light as modulated light from the first reflective liquid-crystal modulating device 21 passes through the polarizing beam splitter 23 at least partially. The reflected light from the first reflective liquid-crystal modulating device 21 further partially passes through the dichroic half mirror prism 63, passes through the λ/4 plate 66, is incident on the objective lens 31 in a state where right-handed circular polarization and left-handed circular polarization are mixed, and allows the work WO on the target stage 40 to be illuminated with. Image light L22 from the work WO passes through the λ/4 plate 66 in a state where P polarization and S polarization are mixed, is partially reflected by the dichroic half mirror prism 63, passes through the lens 64 and the like, and is incident on the CCD camera 67 via the polarizing plate 65. In the above description, also with respect to the illumination light L21, the pattern or image formed by the first reflective liquid-crystal modulating device 21 is projected onto the surface of the work WO by the lens 24 and the objective lens 31, and the surface image of the work WO is formed on the image sensor of the CCD camera 67 by the objective lens 31 and the lens 64. The polarizing plate 65 prevents the illumination light L21 in the P-polarized state from the surface observation light source 61 from being directly incident on the CCD camera 67. By using the surface observation system 60, the pattern formed by the first reflective liquid-crystal modulating device 21 and the base pattern formed on the substrate of the work WO can be superposed and observed, and by operating the stage controller 49 while analyzing the observation result by the control device 90, the target stage 40 can be appropriately moved with respect to the optical modulation unit 20 and the projection optical system 30, so that the pattern or exposing image formed on the reflective liquid-crystal modulating device 21 can be formed at the appropriate position on the work WO.

The surface observation system 60 can not only observe the pattern of the first reflective liquid-crystal modulating device 21 but also observe the pattern of the second reflective liquid-crystal modulating device 22.

Returning to FIG. 1, the autofocus system 70 includes an AF light source 71, a polarizing plate 72, a stripe pattern mask 73, a polarizing beam splitter 74, half mirror prisms 75 and 76, and a first image sensor 77a, a second image sensor 77b, and an AF control circuit 79. The autofocus system 70 shares the lens 64 and the dichroic half mirror prism 63 which constitutes the surface observation system 60.

Figure 4:
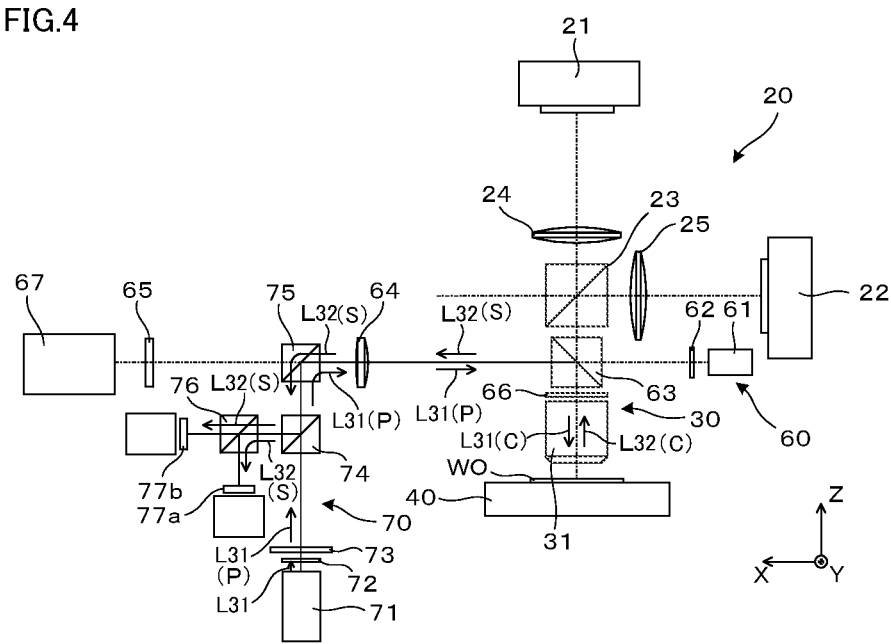
FIG. 4 is an explanatory diagram of an optical path from which an autofocus system is extracted.

FIG. 4 illustrates the autofocus system 70 extracted. The AF light source 71 is configured with, for example, an LED or the like and emits illumination light L31 (for example, yellow light having a wavelength of 567 nm or other visible light) having a long wavelength causing substantially no photosensitivity to a resist formed on the surface of the work WO. In the present embodiment, the wavelength of the illumination light L31 is allowed to be matched with the wavelength of the illumination light L21 of the surface observation system 60. The polarizing plate 72 cuts S polarization and allows the P polarization to be selectively incident on the stripe pattern mask 73 and the polarizing beam splitter 74. The stripe pattern mask 73 is for projecting a stripe pattern on the surface of the work WO at the time of focusing. The polarizing beam splitter 74 transmits the illumination light L31 passing through the stripe pattern mask 73 as it is, and the half mirror prism 75 reflects the illumination light L31 in the P-polarized state and allows the illumination light L31 to be incident on the λ/4 plate 66 through the lens 64 and the dichroic half mirror prism 63. A circularly polarized illumination light L31 passing through the λ/4 plate 66 is incident on the objective lens 31, and the work WO on the target stage 40 is illuminated with the circularly polarized illumination light L31. An image light L32 in the circular polarized state from the work WO passes through the λ/4 plate 66 and becomes S-polarized, is partially reflected by the dichroic half mirror prism 63 and passes through the lens 64 and the like, is bent along the optical path by the half mirror prism 75, and is incident on the polarizing beam splitter 74. The image light L32 reflected by the polarizing beam splitter 74 so as not to return to the AF light source 71 is branched by the half mirror prism 76 and incident on the first image sensor 77a and the second image sensor 77b. In the above description, with respect to the illumination light L31, the stripe pattern of the stripe pattern mask 73 is projected onto the surface of the work WO by the lens 64 and the objective lens 31, and the stripe pattern on the work WO is projected onto the image sensors 77a and 77b by the objective lens 31 and the lens 64. The operations of the image sensors 77a and 77b are controlled by the AF control circuit 79, the AF control circuit 79 can determine whether the objective lens 31 is in a focused state or a front-focus state or a rear-focus state based on the contrast of an image detected by the image sensors 77a and 77b, and can output such an in-focus state or an out-focus state to the control device 90. It is noted that the first image sensor 77a is arranged in the state of being shifted to the front side with respect to the focused state, and the second image sensor 77b is arranged in the state of being shifted to the rear side with respect to the focused state. Therefore, the focused state can be achieved by stopping the ascending/descending of the objective lens 31 at the position where the contrast of the pattern detected by the first image sensor 77a and the contrast of the pattern detected by the second image sensor 77b match with each other while the objective lens 31 is moved up and down in the Z direction by the lens stage 50.

In order to avoid interference, the operation of the surface observation light source 61 of the surface observation system 60 is stopped when the autofocus system 70 operates, and the operation of the AF light source 71 of the autofocus system 70 is stopped when the surface observation system 60 operates. It is noted that, during the exposure described later, the surface observation function is stopped by turning off the light source 61 of the surface observation system 60, and the autofocus function is operated in real time by turning on the light source 71 of the autofocus system 70.

Figure 5:
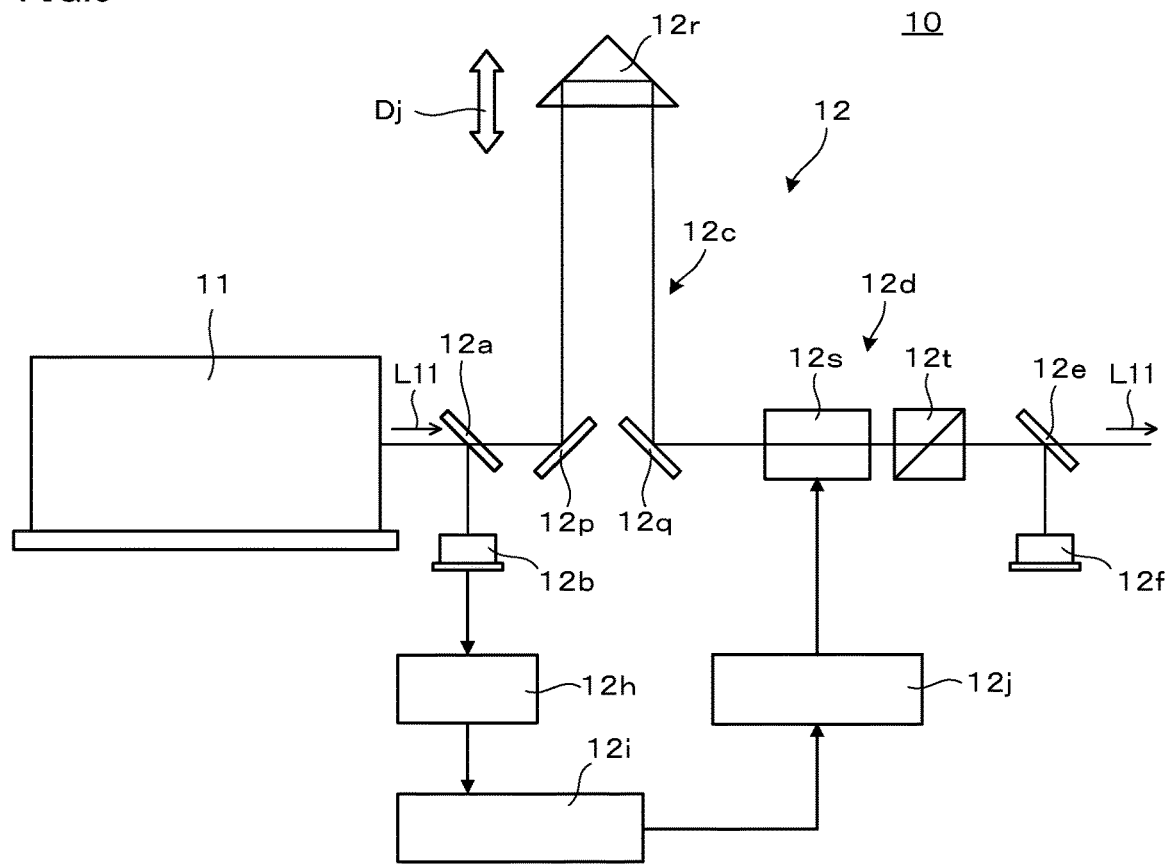
FIG. 5 is a diagram describing a structure of a laser output stabilizing device incorporated in a light source device.

FIG. 5 is a diagram illustrating an example of the structure of the laser output stabilizing device 12 incorporated in the light source device 10 illustrated in FIG. 1. The laser output stabilizing device 12 includes a beam splitter 12a, a first photodiode 12b, an optical delay circuit 12c, an optical switch 12d, a beam splitter 12e, and a second photodiode 12f as an optical system. The laser output stabilizing device 12 includes an integrator 12h, a comparator 12i, and a switch driver 12j as a circuit system. In the laser output stabilizing device 12, the first photodiode 12b can detect the change in the output energy of the pulse laser 11 at an ultra-high speed. An optical delay circuit 12c includes mirrors 12p and 12q and a prism mirror 12r and can compensate for the processing delay in the circuit system. The optical delay circuit 12c can also move the prism mirror 12r in a Dj direction, the optical path length directed toward the optical switch 12d can be extended, and the optical path length can be extended or shortened. The optical switch 12d has a Pockels cell 12s and a polarizing beam splitter 12t and can block the laser light bundle L11 emitted by switching the polarization direction driven by the switch driver 12j. The second photodiode 12b is a sensor for determining whether or not the energy of the laser light bundle L11 output from the laser output stabilizing device 12 has reached a target value. In the above description, the Pockels cell 12s operates even with ultraviolet rays having a wavelength of about 300 nm. Further, the rise time of the operation is about 0.5 ns or less, and a high-speed switch process can be performed.

Figure 6A:
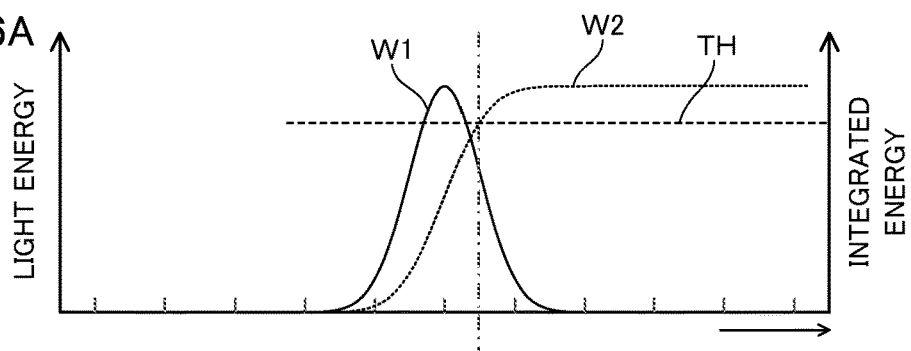
FIGS. 6A and 6B are diagrams describing an operation of a laser output stabilizing device.
Figure 6B:
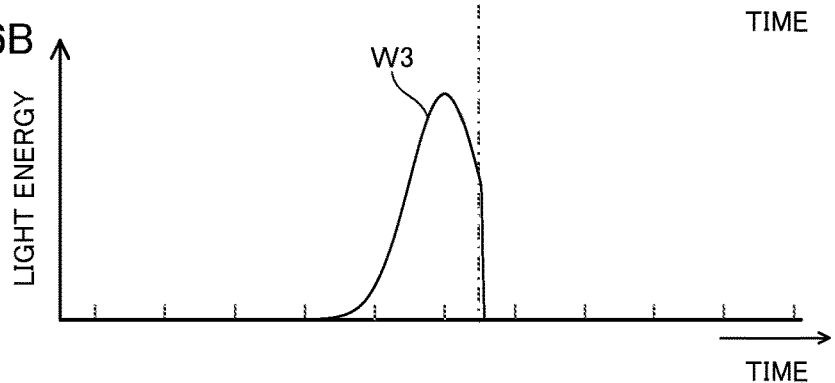

FIG. 6A is a chart illustrating the operation of the laser output stabilizing device 12 and illustrates an input laser waveform W1 detected by the first photodiode 12b and an integrated waveform W2 corresponding to the output of the integrator 12h. The every-time light emission of the input laser waveform W1 is not always stable, and the emission intensity tends to vary when the input laser waveform W1 is emitted the plurality of times. The comparator 12i determines whether or not an energy value of the integrated waveform W2 has reached a predetermined threshold value TH, and when the energy value of the integrated waveform W2 reaches the predetermined threshold value TH, the switch driver 12j switches the Pockels cell 12s from off to on to block the laser light bundle L11. FIG. 6B illustrates the waveform of the laser light bundle L11 output from the laser output stabilizing device 12, and an output laser waveform W3 of the laser light bundle L11 is almost returned to zero at the stage when the energy value of the integrated waveform W2 reaches a predetermined threshold value TH. As the result, the energy of the laser light bundle L11 output from the light source device 10 can be precisely maintained at the target value and stabilized.

Figure 7:
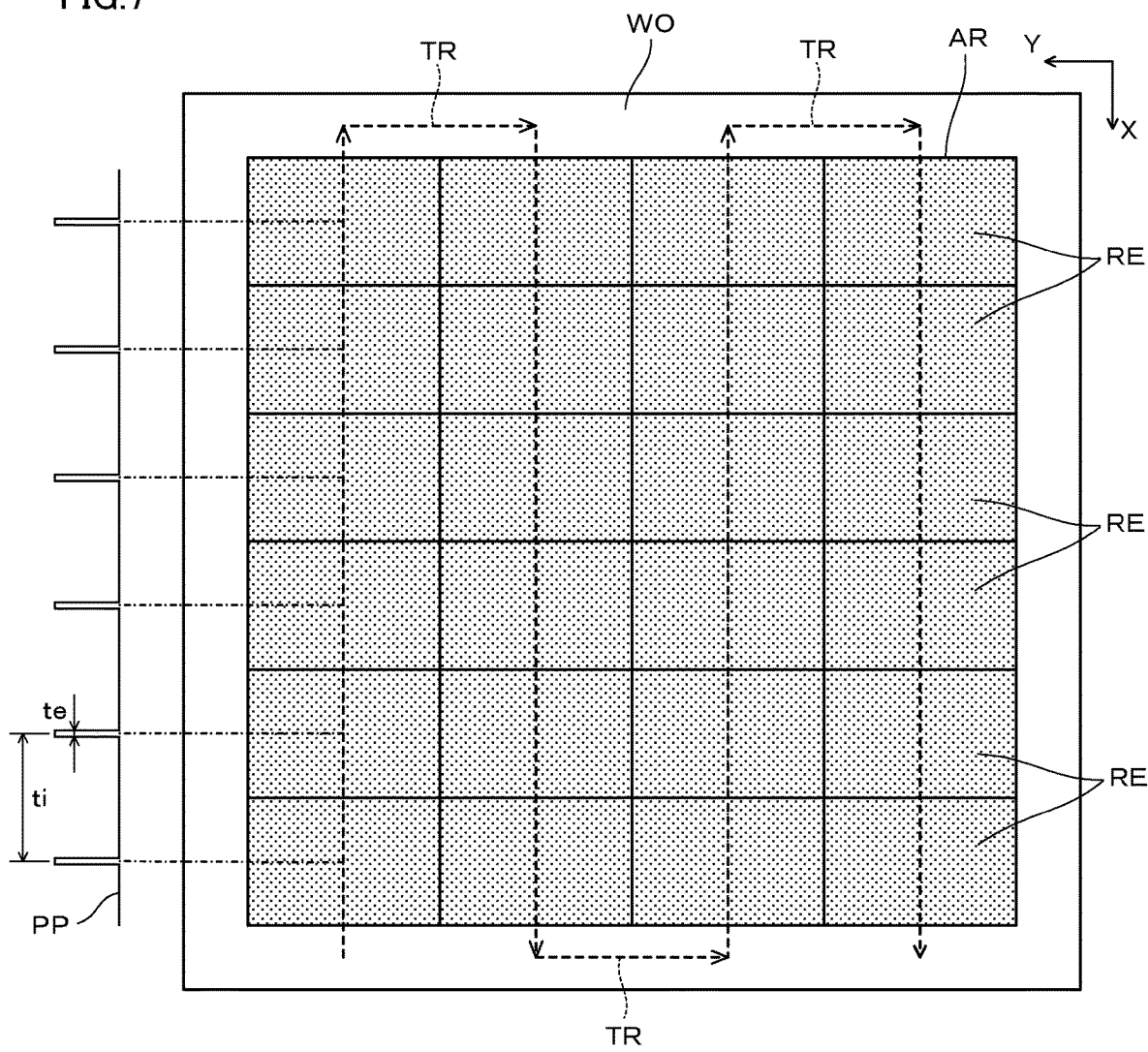
FIG. 7 is a diagram describing a basic operation of exposure.

The exposure operation by the exposure device 100 will be described with reference to FIG. 7. The exposure region AR obtained by combining the plurality of partial regions RE arranged in a matrix is set on the photomask which is the work WO. In this case, 6×4 partial region RE is set, but the setting of the partial region RE can be appropriately changed according to the size of the work WO and the exposure accuracy. In the illustrated example, the partial region RE has, for example, the pixels of the first reflective liquid-crystal modulating device 21 having a pixel size of 0.5 μm×0.5 μm to have 1920 pixels in the horizontal direction and 1200 pixels in the vertical direction and has a size of 0.6 mm×0.96 mm. The work WO is reciprocated at equal intervals as illustrated by the locus TR by using the target stage 40. At this time, intermittent scan type exposure is performed. In the specific embodiment, the width of the partial region RE in the Y direction is 0.96 mm, and the interval of the locus TR is also 0.96 mm. Further, when the work WO is scanned and moved by using the target stage 40 and the shot exposure is performed in synchronization with the scanning movement, the light emission and the exposure are performed by a pulse pattern PP as illustrated on the left side of the drawing. An exposure time te which is the pulse width can be set to a nanosecond level, and an exposure interval ti is set to, for example, 50 ms. During the exposure interval ti, rewriting of the pattern of the first reflective liquid-crystal modulating device 21 and the pattern of the second reflective liquid-crystal modulating device 22 is performed. In the case of the embodiment, since the vertical width of the partial region RE is moved by 0.6 mm at the exposure interval ti=50 ms, the moving speed of the target stage 40 is 12 mm/s. When such a moving speed of the target stage 40 is assumed, the exposure time te at the nanosecond level is extremely short and equivalent to the work WO being substantially stationary, and namely, the exposure light can be generated in a time width that can be considered that the target stage 40 is substantially stopped, and an image shift does not occur during the exposure on the work WO. Moreover, the first reflective liquid-crystal modulating device 21 can be rewritten or switched during the relative movement of the work WO, and low-speed switching of the first reflective liquid-crystal modulating device 21 can be compensated for by the pulse exposure of the light bundle.

Figure 8A:
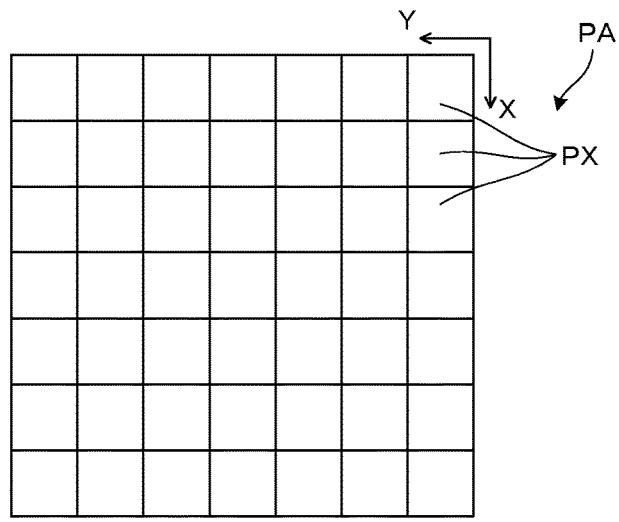
FIGS. 8A to 8F are diagrams describing mode types of exposure.
Figure 8B:
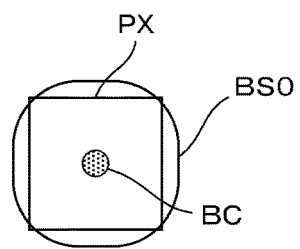
Figure 8C:
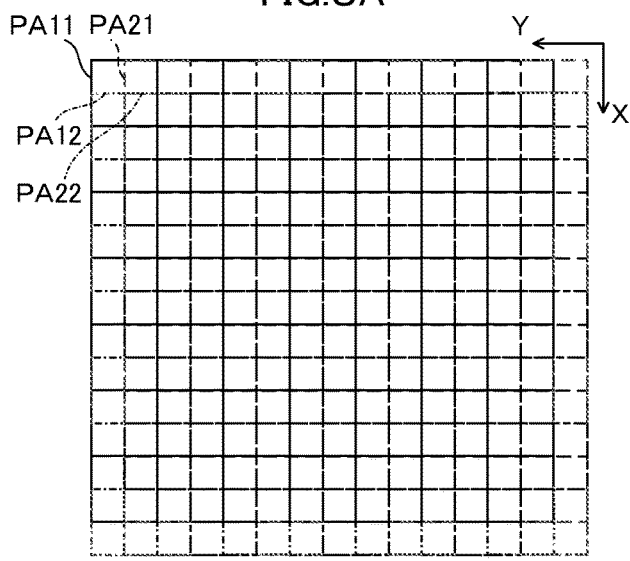
Figure 8D:
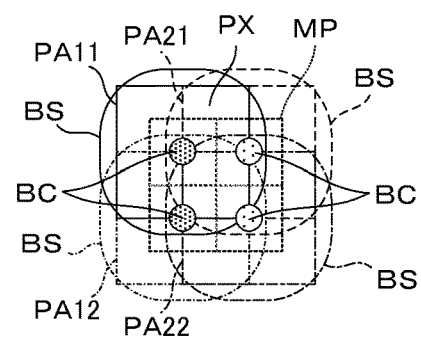
Figure 8E:
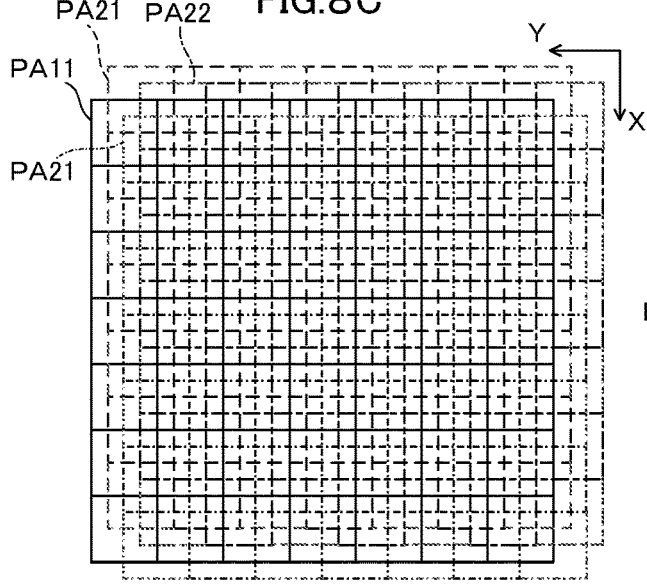
Figure 8F:
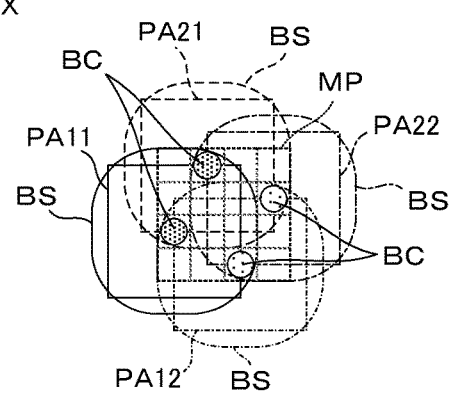

The exposure mode will be described with reference to FIGS. 8A to 8F. FIGS. 8A and 8B are diagrams illustrating operation in a "1×" mode. In this case, only one of the reflective liquid-crystal modulating devices 21 and 22 is operated, pixels PX are arranged in a matrix shape to form a pattern region PA, and a beam spot BS0 corresponding to the pixel PX is formed on the projection side. At the center of the beam spot BS0, the beam center BC is illustrated for ease of viewing. In the "1×" mode, the pixel PX of the reflective liquid-crystal modulating device 21 can be exposed at the resolution substantially equal to the resolution obtained by reduction projection by the objective lens 31. FIGS. 8C and 8D are diagrams illustrating operation in a "2×" mode. In this case, the first reflective liquid-crystal modulating device 21 and the second reflective liquid-crystal modulating device 22 are operated, but a pattern region PA11 of the first reflective liquid-crystal modulating device 21 and a pattern region PA21 of the second reflective liquid-crystal modulating device 22 are arranged to be shifted by half pixel in the −Y direction. Further, the exposure by the first reflective liquid-crystal modulating device 21 and the second reflective liquid-crystal modulating device 22 is performed with being shifted by half pixel in the X direction to perform double exposure, so that the exposure is also performed by the pattern regions PA12 and PA22. As clearly viewed from the arrangement of the beam spot BS and the beam center BC formed by these pattern regions PA11, PA21, PA12, and PA22, it can be seen that the exposure is performed with a grid pattern MP reduced to ½ in the vertical and horizontal directions. By the exposure in the above-mentioned "2×" mode, the edges of the transfer pattern can be smoothed, and the accuracy can be improved. FIGS. 8E and 8F are diagrams illustrating operation in a "4×" mode. In this case, the pattern region PA11 of the first reflective liquid-crystal modulating device 21 and the pattern region PA21 of the second reflective liquid-crystal modulating device 22 are arranged to be shifted by ¼ pixel in the −Y direction and to be shifted by half pixel in the −X direction. Further, the exposure by the first reflective liquid-crystal modulating device 21 and the second reflective liquid-crystal modulating device 22 is performed with being shifted by ¼ pixel in the X direction and with being shifted by half pixel in the −Y direction to perform double exposure, so that the exposure is also performed by the pattern regions PA12 and PA22. As clearly viewed from the arrangement of the beam spot BS and the beam center BC formed by these pattern regions PA11, PA21, PA12, and PA22, it can be seen that the pseudo exposure is performed with the grid pattern MP reduced to ¼ in the vertical and horizontal directions. It is noted that the exposure modes illustrated in FIGS. 8A to 8F are merely examples, and various types of double or more exposures with changed arrangements are possible.

Figure 9:
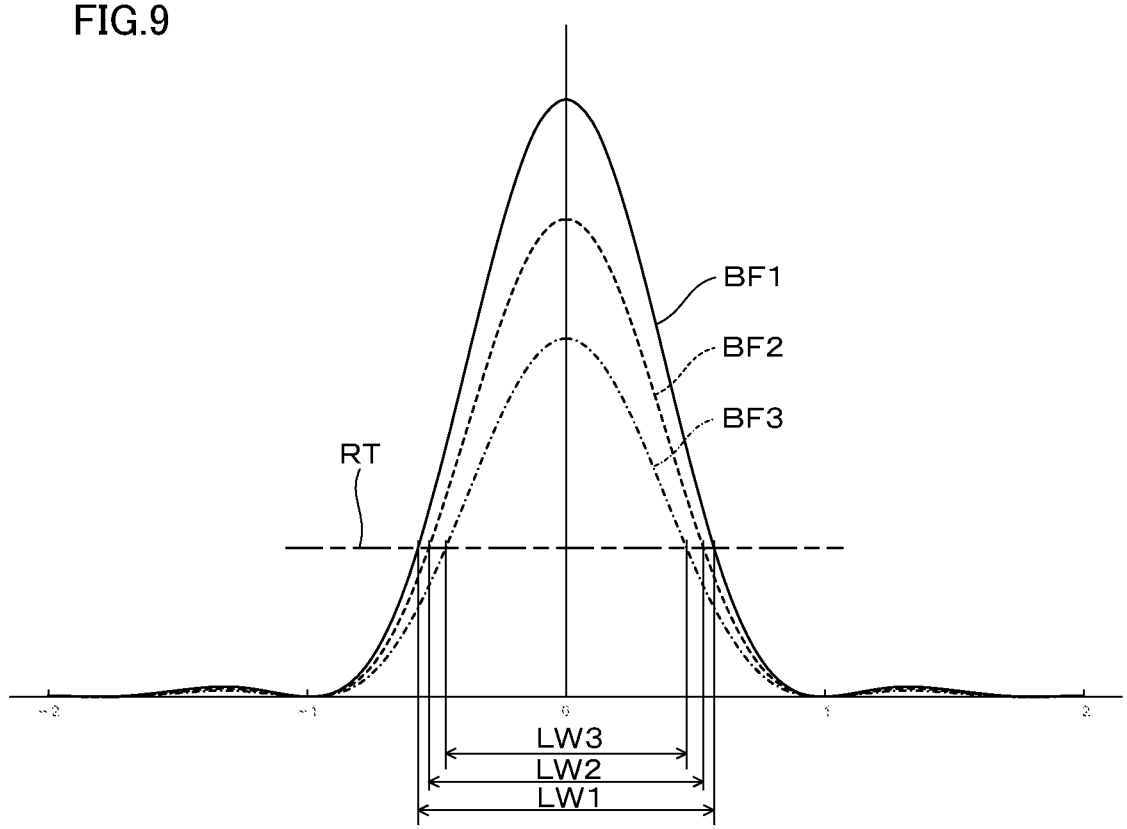
FIG. 9 is a diagram describing a method of adjusting a line width.

FIG. 9 illustrates a beam profile of the exposure light in units of a pixel of the pattern light L12 projected onto the work WO and is a diagram illustrating the exposure on the gray scale. In the figure, the horizontal axis indicates the position on the work WO, and the vertical axis indicates the light intensity projected onto the work WO. By using the light source device 10 described above, the laser light bundle L11 having a stabilized energy value can be generated, and there is a feature that pulse exposure can be performed on a pattern of 1000 shades of gradation as the feature of the reflective liquid-crystal modulating devices 21 and 22. Therefore, it can be seen that the line width of the resist can be adjusted in a range of LW1 to LW3 by various beams BF1 to BF3 of which gradations are adjusted, with the photo-sensitive threshold value of the resist as RT. Such grayscale exposure can be utilized, for example, in various exposure modes illustrated in FIGS. 8A to 8F.

As clearly viewed from the above description, according to the exposure device 100 according to the above-described embodiment, the reflective liquid-crystal modulating devices 21 and 22 are uniformly illuminated with the pulsed laser light bundle L11, and the exposure is performed on the work WO that is a target on the target stage 40 by a pattern imaged by the projection optical system 30 from the pattern light L12 which is the reflected light modulated by the reflective liquid-crystal modulating devices 21 and 22, so that the exposure throughput can be maintained while the illuminance adjustment by the reflective liquid-crystal modulating devices 21 and 22 is performed with high accuracy. It is noted that, when the exposure is performed by changing the region while moving the work support portion of the target stage 40, there is a certain limit to a moving speed from the viewpoint of moving the work support portion of the target stage 40 with high accuracy, and it is easy to perform rewriting the patterns of the reflective liquid-crystal modulating devices 21 and 22 of each picture or screen at a speed corresponding to the speed limit.

The invention is not limited to the above-described embodiment, but the invention can be implemented in various embodiments without departing from the spirit thereof. For example, in the optical modulation unit 20, an exposure pattern can be synthesized by combining three or more reflective liquid-crystal modulating devices. On the contrary, in the optical modulation unit 20, it is not necessary to use the two reflective liquid-crystal modulating devices 21 and 22, and the exposure can be performed only by the single reflective liquid-crystal modulating device 21. However, when the exposure is performed only by the reflective liquid-crystal modulating device 21, it is preferable to improve the light utilization efficiency by converting all the pulse lasers 11 generated by the light source device 10 into S-polarized light. Even when the exposure is performed only by the single reflective liquid-crystal modulating device 21, by repeating the exposure with the locus TR as illustrated in FIG. 7, the superposed exposure can be performed with a predetermined shift amount of the pixel pitch or less similarly to the case illustrated in FIG. 8B or the like.

The structures exemplified as the surface observation system 60 and the autofocus system 70 are merely examples, and it is possible to perform alignment in which the target stage 40 and the projection optical system 30 are appropriately arranged with respect to the optical modulation unit 20 by various methods.

A plurality of the optical modulation units 20 and a plurality of the projection optical systems 30 can be combined side by side to form the device that exposes the large area.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An exposure device comprising:
    a reflective liquid-crystal modulating device;
    a light source device uniformly illuminating a reflective liquid-crystal modulating device with power-stabilized and pulsed laser light in an ultraviolet wavelength band;
    a projection optical system forming an image of reflected light modulated by the reflective liquid-crystal modulating device; and
    a stage supporting a target on which exposure is performed by a pattern imaged by the projection optical system,
    wherein, while moving the target by the stage, exposures are sequentially performed at predetermined periodic timing on partial regions arranged in a grid pattern on the target to expose the entire target,
    wherein the pattern in the reflective liquid-crystal modulating device is rewritten between the exposures,
    wherein the light source device includes a pulse laser, and
    wherein the light source is configured to generate exposure light for each partial region with a pulse width when stage is substantially stopped.

2. The exposure device according to claim 1, wherein superposed exposure is performed with a predetermined shift amount of a pixel pitch or less.

3. The exposure device according to claim 1, further comprising:
    a second reflective liquid-crystal modulating devices; and
    a beam splitter splitting and distributing the laser light from the light source device into the two reflective liquid-crystal modulating devices according to a polarized state,
    wherein the beam splitter synthesizes the reflected light modulated by the two reflective liquid-crystal modulating devices.

4. The exposure device according to claim 3, wherein the beam splitter is a polarizing beam splitter, light having different polarized states is incident on the two reflective liquid-crystal modulating devices, and the reflected light having different polarized states modulated by the two reflective liquid-crystal modulating devices is synthesized.

5. The exposure device according to claim 3, wherein the two reflective liquid-crystal modulating devices have substantially the same pixel array pattern and are arranged so as to cause the predetermined shift in the image synthesized by the polarizing beam splitter.

6. The exposure device according to claim 5, wherein the predetermined shift is the pixel pitch or less.

7. The exposure device according to claim 1, wherein the light source device monitors the pulsed laser light source and energy of the laser light from the pulsed laser light source and blocks an output of the laser light when the energy reaches to a predetermined threshold value.

8. The exposure device according to claim 7, wherein the reflective liquid-crystal modulating device adjusts a line width of the pattern to be exposed to the target by controlling gradation of the reflected light.

9. The exposure device according to claim 1, further comprising a surface observation system monitoring an alignment state of the pattern with respect to the target on the stage,
    wherein the surface observation system superposes and enables to observe the pattern on the reflective liquid-crystal modulating device and the pattern provided on the target on the stage.

10. The exposure device according to claim 1, further comprising an autofocus system monitoring an image-formed state of the target on the stage.

11. The exposure device according to claim 1, wherein superposed exposure is performed with a predetermined shift amount of less than a pixel pitch.

12. The exposure device according to claim 9, further comprising an autofocus system monitoring an image-formed state of the target on the stage,
    wherein the surface observation system is stopped when the autofocus system operates, and an operation of a light source of the autofocus system is stopped when the surface observation system operates.

* * * * *